(12) United States Patent
Shen et al.

(10) Patent No.: US 10,707,249 B2
(45) Date of Patent: Jul. 7, 2020

(54) CAMERA MODULE HAVING SUPPORT MEMBER WITH EXTENSION STRUCTURE

(71) Applicant: NANCHANG O-FILM OPTICAL-ELECTRONIC TECH CO., LTD., Nanchang (CN)

(72) Inventors: Chengzhe Shen, Nanchang (CN); Jun Feng, Nanchang (CN); Shumin Zhu, Nanchang (CN); Shengyun Zhang, Nanchang (CN); Wenhua Shuai, Nanchang (CN); Dong Tang, Nanchang (CN)

(73) Assignee: NANCHANG O-FILM OPTICAL-ELECTRONIC TECH CO., LTD., Nanchang (CN)

( * ) Notice: Subject to any disclaimer, the term of this patent is extended or adjusted under 35 U.S.C. 154(b) by 27 days.

(21) Appl. No.: 16/132,390

(22) Filed: Sep. 15, 2018

(65) Prior Publication Data

US 2019/0088699 A1 Mar. 21, 2019

(30) Foreign Application Priority Data

Sep. 15, 2017 (CN) .......................... 2017 1 0850299

(51) Int. Cl.
*H01L 27/146* (2006.01)
*H04N 5/225* (2006.01)
(Continued)

(52) U.S. Cl.
CPC ........ *H01L 27/14618* (2013.01); *H01L 24/48* (2013.01); *H01L 27/14625* (2013.01);
(Continued)

(58) Field of Classification Search
CPC ......... H01L 27/14618; H01L 27/14625; H01L 24/48; H01L 2924/00014;
(Continued)

(56) References Cited

U.S. PATENT DOCUMENTS

2017/0245363 A1* 8/2017 Wang .................. H04N 5/2253
2017/0264799 A1* 9/2017 Wang .................. H04N 5/2258
(Continued)

OTHER PUBLICATIONS

U.S. Office Action dated Oct. 7, 2019, issued on U.S. Appl. No. 16/132,295 in the name of Nanchang O-Film Optical-Electronic Tech Co., Ltd.

(Continued)

*Primary Examiner* — Gevell V Selby
(74) *Attorney, Agent, or Firm* — Franklin & Associates International Inc; Matthew Lambrinos

(57) ABSTRACT

A camera module includes a circuit board; a photosensitive chip coupled to the circuit board, a package material body attached on the circuit board, and a support member mounted on the package material body. The package material body has a photosensitive surface, which includes a photosensitive region. The support member includes a support body and an extension structure. A side of the support body away from the package material body is coplanar with the extension structure. An orthographic projection of the extension structure on the photosensitive surface is spaced apart from the photosensitive region.

16 Claims, 5 Drawing Sheets

(51) Int. Cl.
 H01L 23/00 (2006.01)
 H05K 3/32 (2006.01)

(52) U.S. Cl.
 CPC ......... *H04N 5/2253* (2013.01); *H04N 5/2254* (2013.01); *H04N 5/2257* (2013.01); *H05K 3/32* (2013.01); *H01L 2224/48091* (2013.01); *H01L 2924/00014* (2013.01)

(58) Field of Classification Search
 CPC .......... H01L 2224/48091; H01L 2224/48227; H04N 5/2253; H04N 5/2257; H04N 5/2254; H04N 5/2251; H05K 3/32
 See application file for complete search history.

(56) References Cited

U.S. PATENT DOCUMENTS

2017/0271390 A1* 9/2017 Wang .................. H04N 5/2253
2018/0007244 A1 1/2018 Wang et al.
2018/0035022 A1* 2/2018 Wang .................. H04N 5/2253
2019/0008988 A1 1/2019 Eder et al.
2019/0086771 A1 3/2019 Shen et al.
2019/0088698 A1 3/2019 Shen et al.
2019/0089881 A1 3/2019 Shen et al.
2019/0089882 A1 3/2019 Shen et al.
2019/0089883 A1 3/2019 Shen et al.
2019/0089885 A1 3/2019 Shen et al.
2019/0148429 A1 5/2019 Wang et al.
2019/0165019 A1 5/2019 Wang et al.

OTHER PUBLICATIONS

Non-Final Office Action dated Aug. 7, 2019 issued on U.S. Appl. No. 16/132,260 to Nanchang O-Film Optical-Electronic Tech Co., Ltd.

* cited by examiner

CAMERA MODULE HAVING SUPPORT MEMBER WITH EXTENSION STRUCTURE

CROSS-REFERENCE TO RELATED APPLICATIONS

This application claims priority to Chinese Patent Application No. 2017108502993, entitled "CAMERA MODULE" filed Sep. 15, 2017, the contents of which is expressly incorporated herein by reference in its entirety.

TECHNICAL FIELD

The present disclosure relates to camera technologies, and more particularly relates to a camera module.

BACKGROUND

As shown in FIG. 1, a conventional camera module 10 includes a circuit board 11, a photosensitive chip 12 located on the circuit board 11, a package material body 13 attached on the circuit board 11 and extending onto the photosensitive chip 12, electronic components 14 and conductive wires 15 in the package material body 13, a filter 16, and a lens assembly. The lens assembly includes a barrel 17 and a lens (not shown) provided in the barrel 17. A stepped hole for receiving the filter 16 is defined on a surface of the package material body 13 away from the circuit board 11. The surface of the package material body 13 away from the circuit board 11 is further used to connect to the barrel 17. As a carrier of the filter 16 and the lens assembly, the package material body 13 needs to have a certain strength. This requires the package material body 13 to have a certain size in each of three directions along X, Y, and Z axes. However, as an optical axis 10a of the camera module 10 is parallel to the Z axis, the larger the length of the package material body 13 in the Z axis direction, the harder for controlling a central axis of a light transmission hole of the package material body 13 to be coaxial with the optical axis 10a. This makes it harder to obtain a camera module having higher imaging quality.

SUMMARY

According to various embodiments of the present disclosure, a camera module is provided.

A camera module includes a circuit board, a photosensitive chip coupled to the circuit board and having a photosensitive surface, a package material body attached on the circuit board, and a support member mounted on a side of the package material body away from the circuit board. The photosensitive surface includes a photosensitive region. The support member includes a support body and an extension structure located on an inner wall of the support body. A side of the support body away from the package material body is coplanar with a side of the extension structure away from the package material body. An orthographic projection of the extension structure away from the support body on the photosensitive surface is spaced apart from the photosensitive region.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Reference will now be made to the drawings to describe, in detail, embodiments of the present camera module. It should be noted that references to "an" or "one" embodiment in this disclosure are not necessarily to the same embodiment, and such references mean at least one.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 2:
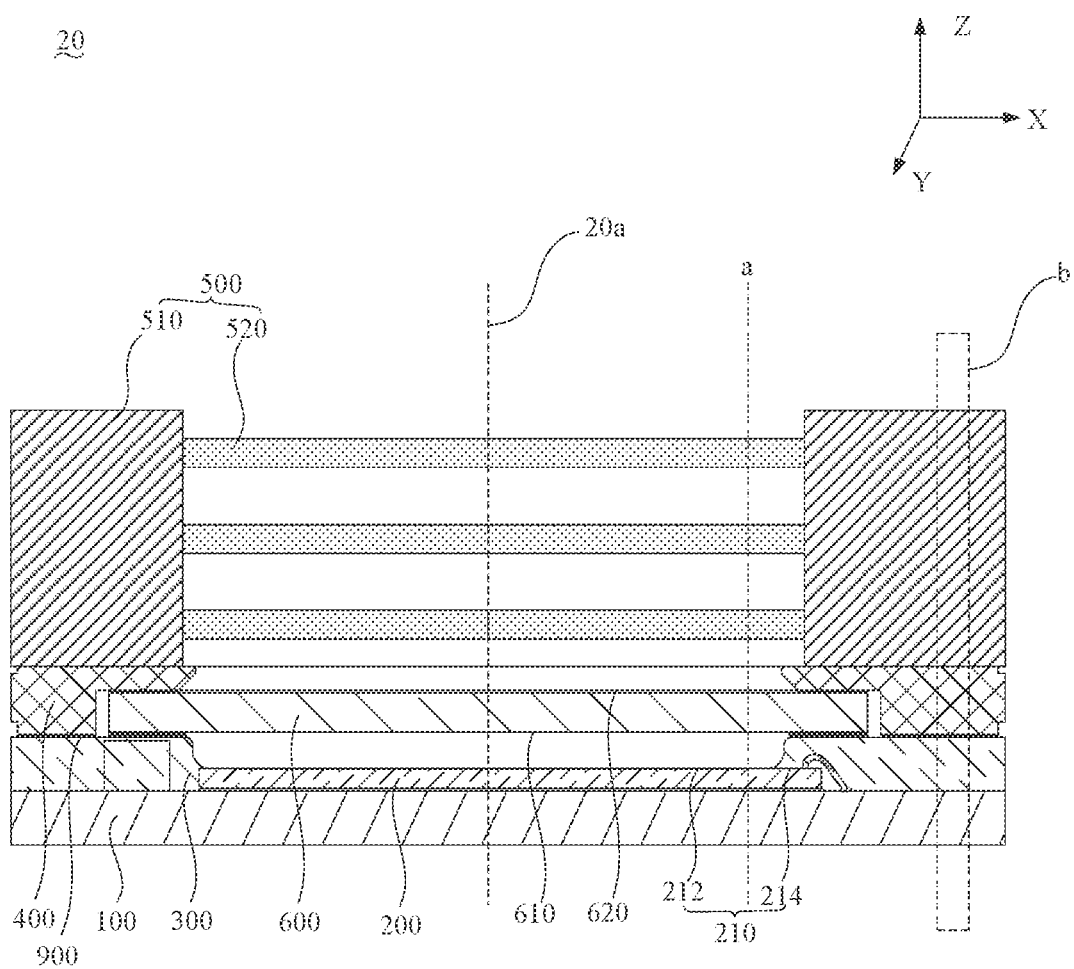
FIG. 2 is a cross-sectional view of a camera module in accordance with an embodiment.
Figure 3:
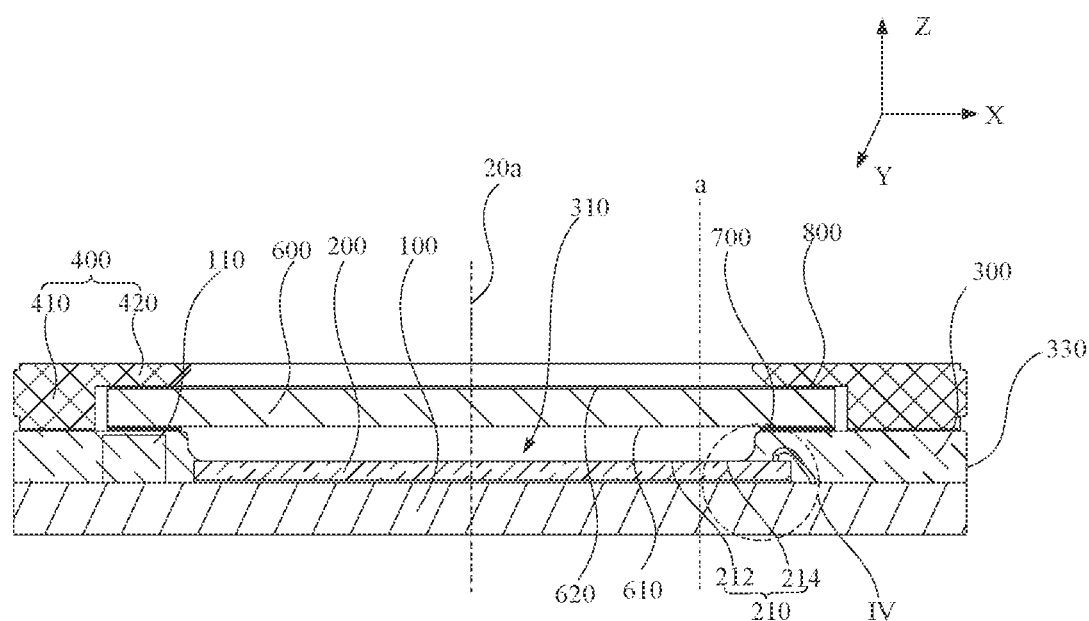
FIG. 3 is a cross-sectional view of the camera module of FIG. 2 after removing a lens assembly.

As shown in FIGS. 2 and 3, a camera module 20 in accordance with an embodiment includes a circuit board 100, a photosensitive chip 200, a package material body 300, a support member 400, a lens assembly 500, and a filter 600. The camera module 20 can be rectangular, cylindrical, and etc. In a space coordinate system, the camera module 20 has a certain length in the X-axis direction, a certain width in the Y-axis direction, and a certain distance in the Z-axis direction. The camera module 20 has an optical axis 20a. The optical axis 20a is parallel to the Z axis.

The photosensitive chip 200 is coupled to the circuit board 100. The package material body 300 is attached on the circuit board 100. The support member 400 is mounted on a side of the package material body 300 away from the circuit board 100. The lens assembly 500 is located on a side of the support member 400 away from the circuit board 100. The lens assembly 500 includes a barrel 510 and a plurality of lenses 520 received in the barrel 510. Compared with a conventional two-stage structure composed of the package material body and the lens assembly, the camera module 20 has a three-stage structure composed of the package material body 300, the support member 400, and the lens assembly 500, where part of package material body in the conventional two-stage structure is replaced by the support member, such that the package material body 300 can have a relatively smaller length in the Z-axis direction. The smaller the length of the package material body 300 in the Z-axis direction, the easier the control of an alignment of the optical axis 20a of the camera module is. Thus a camera module 20 with a higher imaging quality is obtained.

As shown in FIGS. 2 and 3, in the illustrated embodiment, the photosensitive chip 200 includes a photosensitive surface 210 adjacent to the support member 400. The photosensitive surface 210 includes a photosensitive region 212 and a non-photosensitive region 214 surrounding the photosensitive region 212. A line formed by intersecting of a dotted line a and the photosensitive chip 200 illustrates the junction between the photosensitive region 212 and the non-photosensitive region 214. The package material body 300 encapsulates at least a portion of the non-photosensitive region 214. Thus, the connection between the photosensitive chip 200 and the circuit board 100 can be reinforced. In addition, when the package material body 300 extends towards an inside of the non-photosensitive region 214, the size of the package material body 300 in the XY plane can be reduced without changing the bearing strength of the package material body 300.

Referring to FIGS. 2 and 3, a portion of the non-photosensitive region 214 is embedded in the package material body 300, while the remaining portion of the non-photosensitive region 214 is exposed. During forming the package material body 300, if the material of the package material body 300 leaks out, the exposed non-photosensitive region 214 can receive the leaked material, thereby avoiding the leaked material from flowing to the photosensitive region 212. In other words, the exposed non-photosensitive region 214 can prevent the photosensitive region 212 from being contaminated.

Figure 4:
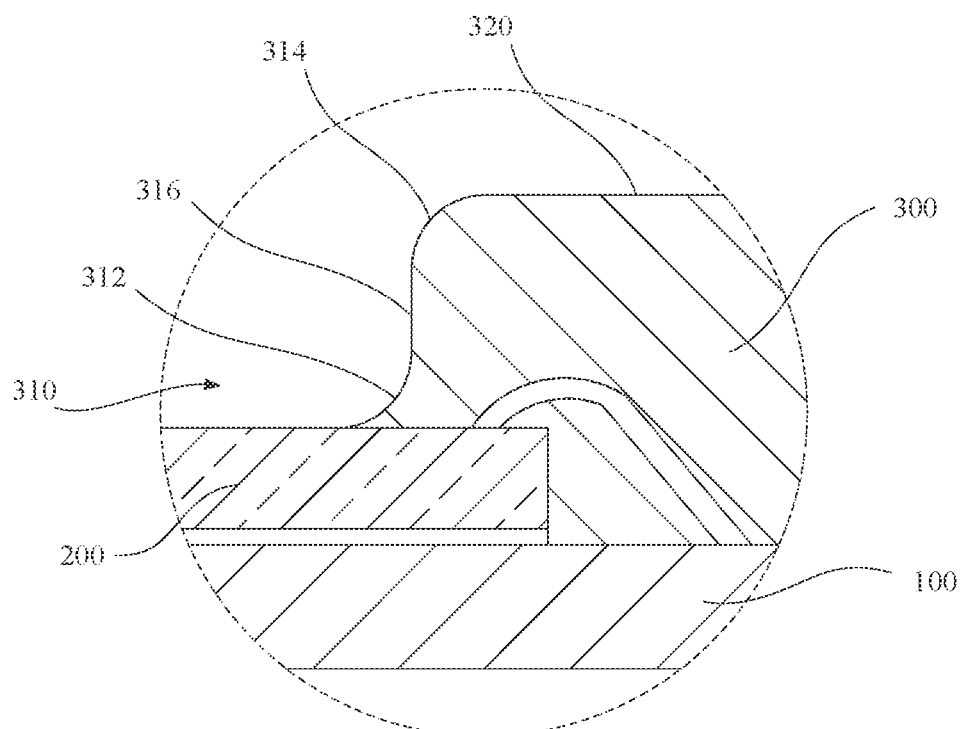
FIG. 4 is an enlarged view of portion IV of FIG. 3.

In addition, as shown in FIGS. 3 and 4, in the illustrated embodiment, the package material body 300 includes a bearing surface 320 away from the circuit board 100 and an outer sidewall 330. The package material body 300 defines a light transmission hole 310 in a middle portion thereof. A bottom of the package material body 300 in the light transmission hole 310 is provided with a concave surface 312 that is recessed toward the outer sidewall 330. This can facilitate a demolding of an injection mold for forming the package material body 300 and avoid the damage to the package material body 300, thus further improving the image quality of the camera module 20.

It should be understood that, in alternative embodiments, the photosensitive chip 200 can also be received in the light transmission hole 310 and spaced apart from an inner wall in the light transmission hole 310. That is, the package material body 300 does not cover the non-photosensitive region 214.

Further, in the illustrated embodiment, a round chamfer 314 is provided on a top edge of the package material body 300 in the light transmission hole 310. When attaching the support member 400 to the package material body 300, excess adhesive can flow inwardly onto the round chamfer 314. The round chamfer 314 has a greater resistance for the flow of the adhesive than a right-angled edge, such that a flow speed of the adhesive can be reduced and the adhesive can be deposited on the round chamfers 314. Further, the round chamfer 314 has a larger surface area than the right-angled edge, thereby receiving more adhesive. Thus, the adhesive can be effectively prevented from flowing to the photosensitive region 212.

In addition, in the illustrated embodiment, the sidewall of the package material body 300 in the light transmission hole 310 further includes a connecting surface 316 connecting the concave surface 312 and the round chamfer 314. The connecting surface 316 is perpendicular to the photosensitive chip 200. In other embodiments, the connecting surface 316 can also be inclined to the photosensitive chip 200.

Figure 5:
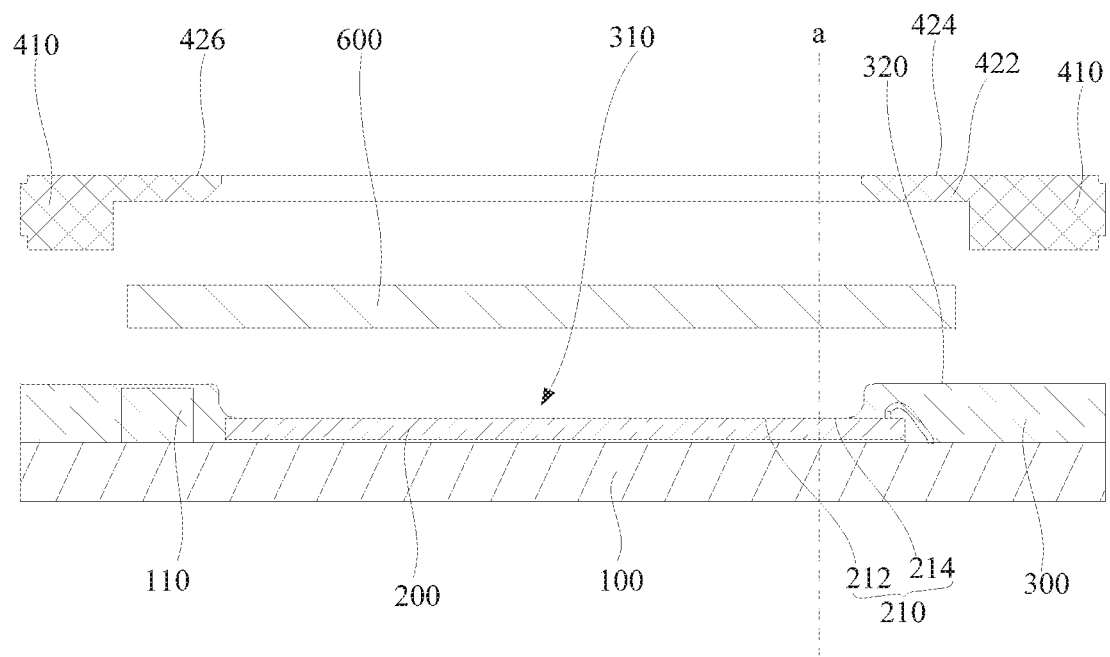
FIG. 5 is a cross-sectional view illustrating a package material body, a support member, and a filter of FIG. 3 in a disassembled state.

As shown in FIGS. 3 and 5, the support member 400 includes a hollow support body 410 with a rectangular cross section and an extension structure 420 formed on an inner wall of the support body 410. The extension structure 420 includes a bottom surface 422 adjacent to the package material body 300 and a top surface 424 facing away from the bottom surface 422.

The filter 600 is sandwiched between the bearing surface 320 of the package material body 300 and the bottom surface 422, therefore the filter 600 can be connected to at least one of the inner wall of the support body 420, the bearing surface 320, and the bottom surface 422. For example, the filter 600 can be connected to any one of the inner wall of the support body 410, the bearing surface 320 and the bottom surface 422, and can also be connected to both of the bearing surface 320 and the bottom surface 422. Thus, when the camera module 20 is applied to a harsh environment, for example, in an environment with high vibration intensity, the extension structure 420 can prevent a detached filter 600 from moving to the lens assembly 500.

Figure 6:
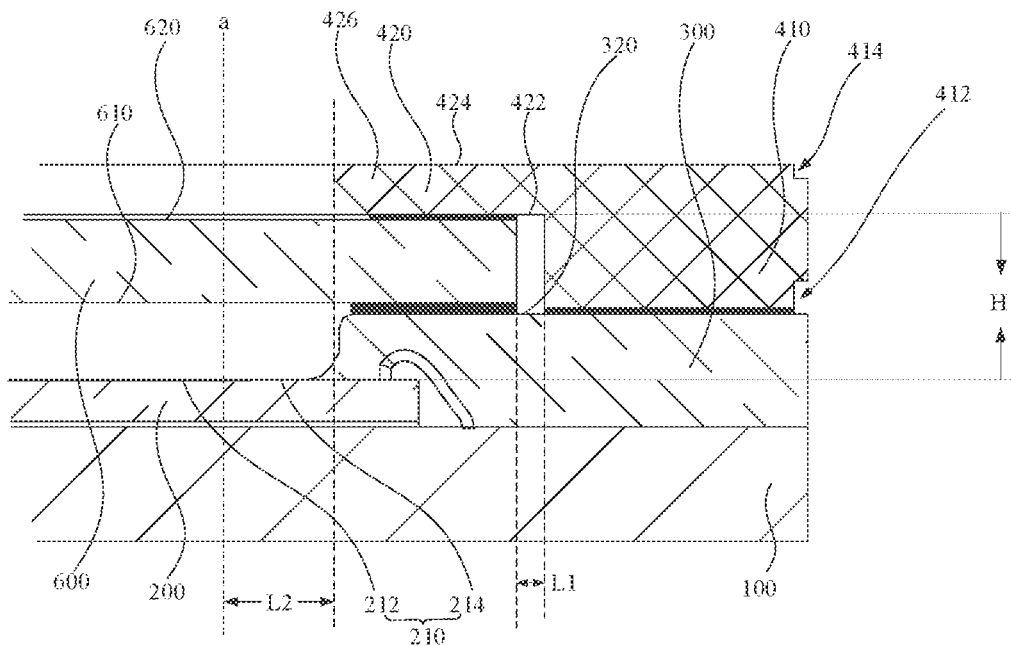
FIG. 6 is an enlarged view of the right side of the camera module of FIG. 3.

Specifically, further referring to FIG. 6, the filter 600 has opposed first and second surfaces 610, 620. The first surface 610 is connected to the bearing surface 320, and the second surface 620 is connected to the bottom surface 422. In this way, the connecting area of the filter 600 is doubled comparing with that the filter 600 is connected to only one of the bearing surface 320 and the bottom surface 422, which ensures the connecting stability thereof, so that the camera module 20 can be applied to a harsh environment. Moreover, the size of the camera module 20 can be reduced without changing the connecting area, thereby the camera module 20 with a smaller size is obtained.

Since the filter 600 is sandwiched between the extension structure 420 and the package material body 300, both of the support body 410 and the side of the extension structure 420 away from the package material body 300 can be used to hold the lens assembly 500. In other words, the lens assembly 500 can be located not only on the support body 410 but also on the extension structure 420. Therefore the connection area between the lens assembly 500 and the support member 400 can be increased, and the barrel 510 can be firmly connected to the support member 400.

Figure 1:
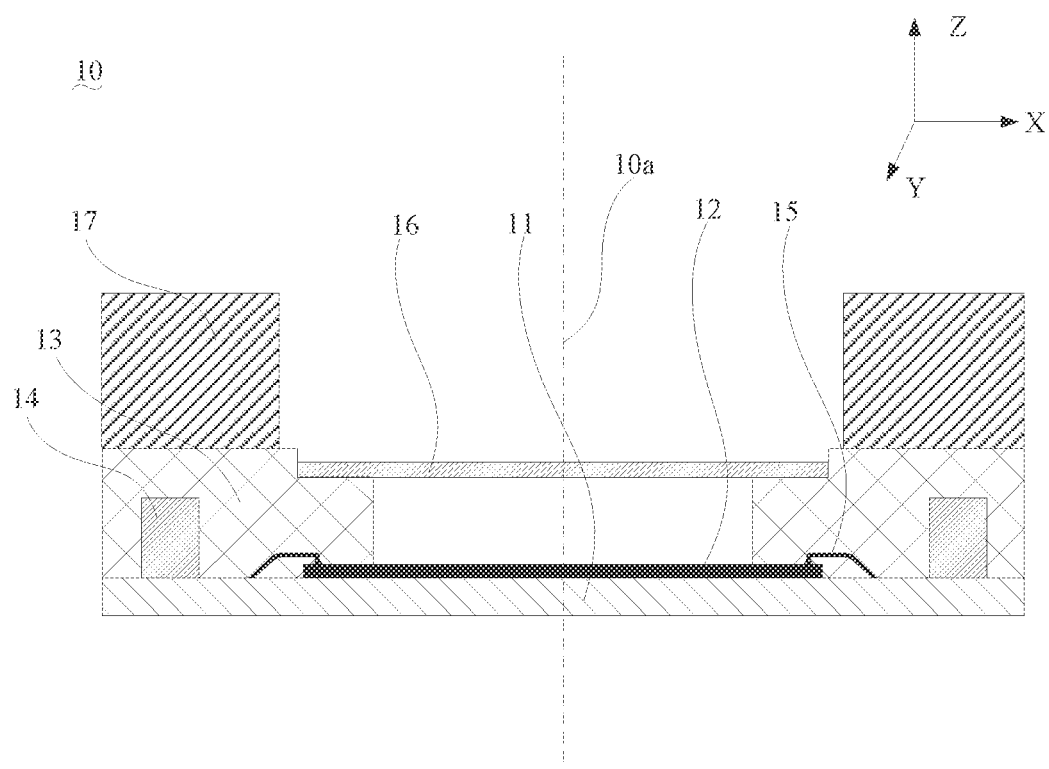
FIG. 1 is a cross-sectional view of a conventional camera module.

As shown in FIG. 1, in the conventional camera module 10, the barrel 17 and the filter 16 are both located on the package material body 13. The barrel 17 and the filter 16 are spaced apart on the XY plane, and are not aligned (overlapped) with each other in the Z-axis direction, which results in the large size of the camera module 10 in the XY plane. While in the illustrated embodiment, referring to FIG. 2, the lens assembly 500 is not only located on the support body 410 but also one the extension structure 420, so that the barrel 510 and the filter 600 are partially overlapped in the Z-axis direction. On the premise that the barrel 510 and the support member 400 have a certain connection area (which is substantially equal to the conventional connection area), a portion of barrel 510, a portion of support body 410 located within an area enclosed by the dashed frame b of FIG. 2, and a portion of circuit board 100 and a portion of package material body 300 located on the portion of support body 410 can be omitted, thereby reducing the size of the camera module 20 in the XY plane. The camera module 20 with a much more smaller size is obtained.

As shown in FIGS. 2 and 3, in the illustrated embodiment, a side of the support body 410 away from the package material body 300 is coplanar with a side of the extension structure 420 away from the package material body 300. This makes it more convenient for the barrel 510 to be located on both of the support body 410 and the extension structure 420.

In addition, as shown in FIG. 3, in the illustrated embodiment, the camera module 20 further includes a first adhesive layer 700 and a second adhesive layer 800. The first adhesive layer 700 is located between the first surface 610 and the bearing surface 320. The second adhesive layer 800 is located between the second surface 620 and the bottom surface 422. During assembling, the filter 600 can be firstly attached to the extension structure 420 via the second adhesive layer 800, and the filter 600 can be adjusted to be coplanar with the side of the support body 410 adjacent to package material body 300 by adjusting a thickness of the first adhesive layer 700, which makes it convenient to attach the support member 400 to the package material body 300 and to attach the filter 600 to the package material body 300.

Further, as shown in FIGS. 3 and 6, in the illustrated embodiment, the filter 600 is spaced apart from the inner wall of the support body 410. In other words, a gap L1 is defined between the filter 600 and the inner wall of the support body 410. The gap L1 can prevents the filter 600 from being broken due to an extrusion during mounting the filter 600. The gap L1 can be further used to receive excess adhesive during attaching the filter 600 and the support member 400 to each other and attaching the support member 400 and the package material body 300 to each other. Furthermore, a distance (width of the gap L1) between the filter 600 and the inner wall of the support body 410 ranges from about 50 μm to about 1500 μm, in one embodiment, from about 100 μm to about 500 μm. This can not only effectively prevent the filter 600 from being broken due to the extrusion, but also avoid the overlapping area between the filter 600 and the extension structure 420 from being reduced because of a too wide gap L1 thereby making it possible for the filter 600 to be firmly connected to the extension structure 420. Specifically, in the illustrated embodiment, the distance (gap L1) is 100 μm.

In addition, as shown in FIG. 6, in the illustrated embodiment, an orthographic projection of the extension structure 420 on the photosensitive surface 210 is located within the non-photosensitive region 214. In other words, the orthographic projection of the extension structure 420 on the photosensitive surface 210 is spaced apart from the photosensitive region 212. Thus, the extension structure 420 can be prevented from blocking the light emitted to the photosensitive region 212, so that the camera module 20 can have a good imaging quality.

In addition, a distance L2 from a distal end of the orthographic projection of the extension structure 420 away from the support body 410 on the photosensitive surface 210 to the photosensitive region 212 ranges from about 100 μm to about 500 μm. This can not only prevent the extension structure 420 from blocking the light emitted to the photosensitive region 212, but also ensure that the extension structure 420 and the filter 600 have a large connecting area to firmly connect the filter 600 to the support member 400.

In one embodiment, the distance L2 ranges from about 200 μm to about 400 μm. Specifically, in the illustrated embodiment, the distance L2 is 300 μm.

Further, as shown in FIG. 6, the distance H between the photosensitive surface 210 and the bottom surface 422 ranges from about 150 μm to about 1500 μm. Furthermore, in the illustrated embodiment, the distance H ranges from about 500 μm to about 1000 μm. In this way, the support member 400 can be prevented from blocking the light, thereby improving the imaging quality of the camera module 20.

Figure 7:
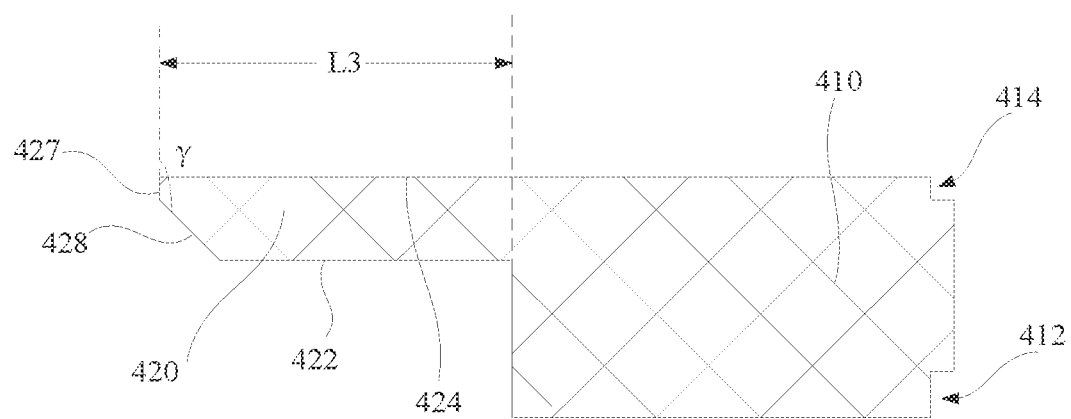
FIG. 7 is an enlarged view of the right side of the support member of FIG. 3.

In addition, as shown in FIG. 7, a distance L3 between an end of the extension structure 420 away from the support body 410 and the support body 410 ranges from about 200 μm to about 1500 μm. Further, the distance L3 ranges from about 500 μm to about 900 μm. Specifically, in the illustrated embodiment, the length L3 is 800 μm. In this way, it can be ensured that the filter 600 and the extension structure 420 have a large overlapping area to firmly connect the filter 600 with the extension structure 420. It can also be avoided that a size of the camera module 20 in the XY plane becomes larger caused by a longer distance between the end of the extension structure 420 away from the support body 410 and the support body 410.

In addition, as shown in FIG. 7, in the illustrated embodiment, the extension structure 420 further includes a vertical surface 427 away from the support body 410 and an inclined surface 428 connected between the right-angled edge 427 and the bottom surface 422. An angle γ between the vertical 427 and the inclined surface 428 is greater than 90°. In one embodiment, the angle γ is about 135°. Thus, when attaching the lens assembly 500 to the support member 400, excess adhesive will flow along the right-angled edge 427 and the inclined surface 428, thereby preventing the excess adhesive from dropping onto the photosensitive chip 200.

In addition, as shown in FIGS. 6 and 7, in the illustrated embodiment, the support body 410 defines a first notch 412 on the outer sidewall thereof adjacent to the package material body 300. When attaching the support member 400 to the package material body 300, the first notch 412 can be used to receive excess adhesive to prevent or reduce the flow of adhesive onto the outer sidewall of the package material body 300.

The support body 410 further defines a second notch 414 in the outer sidewall thereof away from the package material body 300. When attaching the lens assembly 500 to the support member 400, the second notch 414 can be used to receive excess adhesive to prevent or reduce the flow of adhesive onto the outer sidewall of the support member 400.

In addition, as shown in FIGS. 2 and 3, in the illustrated embodiment, the camera module 20 further includes a third adhesive layer 900 sandwiched between the support body 410 and the package material body 300, and a fourth adhesive layer (not shown) sandwiched between the barrel 510 and the support body 410 and the extension structure 420.

In the illustrated embodiment, the lens assembly 500 is located on the photosensitive (optical axis 20*a*) path of the photosensitive chip 200 via the package material body 300 and the support member 400.

When assembling, the package material body 300 with a smaller length in the Z axis direction is formed firstly by using a fabrication process. The central axis of the light transmission hole 310 of the package material body 300 is aligned with the optical axis 20*a* when the package material body 300 is finished. Then, the support member 400 provided with the filter 600 is located on the package material body 300. Specifically, the central axis of the support member 400 is aligned with the optical axis 20*a* via coating adhesive on a side surface of the support body 410 adjacent to the package material body 300 or the bearing surface 320 and adjusting the thickness of the adhesive. Finally, the central axis of the lens assembly 500 is aligned with the optical axis 20*a* via coating adhesive on a side surface of the support body 410 away from the package material body 300 or coating adhesive on the side surface of the lens assembly 500 and adjusting the thickness of the adhesive thereof. The alignment between the central axis of the support member 400 and the optical axis 20*a* and the alignment between the central axis of the lens assembly 500 and the optical axis 20*a* are separately controlled, which can reduce the control difficulty of each alignment adjusting, thereby reducing the processing requirement for manufacturing the camera module 20.

The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A camera module, comprising:
   a circuit board;
   a photosensitive chip coupled to the circuit board and having a photosensitive surface, the photosensitive surface comprising a photosensitive region;
   a package material body attached on the circuit board; and
   a support member mounted on a side of the package material body away from the circuit board; wherein the support member comprises a support body and an extension structure located on an inner wall of the support body, a side of the support body away from the package material body is coplanar with a side of the extension structure away from the package material body, and an orthographic projection of the extension structure on the photosensitive surface is spaced apart from the photosensitive region; and
   wherein a distance from a distal end of the orthographic projection of the extension structure away from the support body on the photosensitive surface to the photosensitive region ranges from about 100 μm to about 500 μm.

2. The camera module according to claim 1, wherein the distance between the distal end of the orthographic projection of the extension structure away from the support body on the photosensitive surface and the photosensitive region ranges from about 200 μm to about 400 μm.

3. The camera module according to claim 1, wherein a distance between the support body and end of the extension structure away from the support body ranges from about 200 μm to about 1500 μm.

4. The camera module according to claim 3, wherein the distance between the support body and the end of the extension structure away from the support body ranges from about 500 μm to about 900 μm.

5. The camera module of claim 1, wherein the extension structure comprises a bottom surface adjacent to the package material body, and a distance between the photosensitive surface and the bottom surface ranges from about 150 μm to about 1500 μm.

6. The camera module according to claim 5, wherein the distance between the photosensitive surface and the bottom surface ranges from about 500 μm to about 1000 μm.

7. The camera module according to claim 1, wherein the package material body comprises a bearing surface away from the circuit board, and the extension structure comprises a bottom surface adjacent to the package material body; the camera module further comprises a filter located in the support body, and the filter is connected to at least one of the inner wall of the support body, the bearing surface, and the bottom surface of the extension structure.

8. The camera module of claim 7, wherein the filter is spaced apart from the inner wall of the support body.

9. The camera module of claim 1, wherein the camera module further comprises a lens assembly, the lens assembly comprises a barrel and a plurality of lenses received in the barrel, and the barrel is connected to both of the support body and the extension structure.

10. The camera module of claim 1, wherein the photosensitive surface further comprises a non-photosensitive region surrounding the photosensitive region, and the package material body encapsulates at least a portion of the non-photosensitive region.

11. The camera module according to claim 1, wherein the package material body defines a light transmission hole in a middle portion thereof, and a bottom of the light transmission hole is provided with a concave surface recessed toward an outer sidewall of the package material body.

12. The camera module according to claim 11, wherein a round chamfer is provided on a top edge of the package material body in the light transmission hole.

13. The camera module according to claim 1, wherein the extension structure comprises a bottom surface adjacent to the package material body, a right-angled edge away from the support body, and an inclined surface connected between the right-angled edge and the bottom surface, an angle γ between the right-angled edge and the inclined surface is greater than 90°.

14. The camera module according to claim 13, wherein the angle γ between the right-angled edge and the inclined surface is about 135°.

15. The camera module according to claim 1, wherein the support body defines a first notch on an outer sidewall thereof adjacent to the package material body for receiving excess adhesive when attaching the support member and the package.

16. The camera module according to claim 1, wherein the support body defines a second notch on the outer sidewall thereof away from the package material body for receiving excess adhesive when attaching a lens assembly and the support member.

* * * * *